(12) United States Patent
Snyder et al.

(10) Patent No.: US 11,224,118 B2
(45) Date of Patent: Jan. 11, 2022

(54) BUSSING AND PRINTED CIRCUIT BOARD INTEGRATION WITH POWER ELECTRONICS

(71) Applicant: SAFT AMERICA, Cockeysville, MD (US)

(72) Inventors: James Snyder, Cockeysville, MD (US); Jared Good, Cockeysville, MD (US)

(73) Assignee: SAFT AMERICA, Cockeysville, MD (US)

( * ) Notice: Subject to any disclaimer, the term of this patent is extended or adjusted under 35 U.S.C. 154(b) by 0 days.

(21) Appl. No.: 16/716,827

(22) Filed: Dec. 17, 2019

(65) Prior Publication Data

US 2021/0185794 A1 Jun. 17, 2021

(51) Int. Cl.
*H05K 1/02* (2006.01)
*H01M 50/50* (2021.01)
(Continued)

(52) U.S. Cl.
CPC ........ *H05K 1/0204* (2013.01); *H01M 10/425* (2013.01); *H01M 50/502* (2021.01); *H01M 50/505* (2021.01); *H01M 50/519* (2021.01); *H05K 1/144* (2013.01); *H01M 2220/30* (2013.01); *H05K 2201/09072* (2013.01); *H05K 2201/10022* (2013.01); *H05K 2201/10037* (2013.01); *H05K 2201/10106* (2013.01); *H05K 2201/10166* (2013.01); *H05K 2201/10272* (2013.01)

(58) Field of Classification Search
CPC .. H05K 1/0204; H05K 1/0206; H05K 1/0207; H05K 1/0209; H05K 1/021; H05K 1/0212; H05K 1/144; H05K 2201/09072; H05K 2201/10022; H05K 2201/10106; H05K 2201/10166; H05K 2201/10272; H01M 50/519; H01M 50/502; H01M 50/505; H01M 10/425; H01M 2220/30
See application file for complete search history.

(56) References Cited

U.S. PATENT DOCUMENTS 6,088,227 A * 7/2000 Bujtas ................. H05K 1/0263
361/719
6,146,778 A * 11/2000 Rouillard ............ H01M 10/613
429/7
(Continued)

FOREIGN PATENT DOCUMENTS

CN 100435304 C 11/2008
CN 102076165 A 5/2011
(Continued)

OTHER PUBLICATIONS

Extended European Search Report dated May 14, 2021 in European Application No. 20209932.1.

*Primary Examiner* — Hoa C Nguyen
(74) *Attorney, Agent, or Firm* — Sughrue Mion, PLLC

(57) ABSTRACT

A power electronics assembly may include a power component having a thermally and electrically conductive surface; a printed circuit board having a slot; and a bussing element having a protrusion that directly contacts the thermally and electrically conductive surface of the power component via the slot of the printed circuit board, the printed circuit board being disposed between the power component and the bussing element.

6 Claims, 10 Drawing Sheets

(51) Int. Cl.
*H01M 50/519* (2021.01)
*H01M 50/502* (2021.01)
*H01M 50/505* (2021.01)
*H01M 10/42* (2006.01)
*H05K 1/14* (2006.01)

(56) References Cited

U.S. PATENT DOCUMENTS

| | | |
|---|---|---|
| 2006/0061327 A1 | 3/2006 | Shen |
| 2016/0093849 A1* | 3/2016 | DeKeuster ............ H01M 50/20 |
| | | 429/61 |
| 2019/0166691 A1 | 5/2019 | Kim |
| 2019/0208617 A1* | 7/2019 | Kita ....................... H05K 1/181 |

FOREIGN PATENT DOCUMENTS

| | | |
|---|---|---|
| CN | 102076174 A | 5/2011 |
| CN | 208369458 U | 1/2019 |
| DE | 10 2016 201 163 A1 | 7/2017 |
| DE | 10 2016 211 995 A | 1/2018 |
| DE | 10 2017 205 606 A1 | 10/2018 |
| DE | 11 2017 006 280 T5 | 9/2019 |
| EP | 2 101 550 A1 | 9/2009 |
| EP | 2 283 715 | 2/2011 |
| EP | 2 526 613 | 11/2012 |
| EP | 3 285 140 A1 | 2/2018 |
| EP | 3 432 692 A1 | 1/2019 |
| JP | 2011-172356 A | 9/2011 |
| KR | 10-0747973 B1 | 8/2007 |
| WO | 2011/113867 A1 | 9/2011 |
| WO | 2015/135249 A1 | 9/2015 |

\* cited by examiner

BUSSING AND PRINTED CIRCUIT BOARD INTEGRATION WITH POWER ELECTRONICS

FIELD

Apparatuses and methods consistent with example embodiments relate to an electronics assembly including a power component, a printed circuit board (PCB), and a bussing element.

BACKGROUND

Modern power electronic components such as metal-oxide-semiconductor field effect transistors (MOSFETs) are capable of very high levels of current if they are thermally managed. To use the full capability of these components, they are typically cooled through the mounting surface on the base of the component. That is, they are typically cooled through the same surface which comprises the electrical connection. The most common circuit board construction, known as FR-4, is a composite (typically several layers) of glass-reinforced epoxy where circuit traces are printed with copper foil. The epoxy-glass material has low thermal conductivity and is thus not capable of removing enough heat to allow modern power electronic components to operate to their full potential.

In high power applications, circuit board construction typically utilizes a metal (and thus electrically conductive) substrate coated with a thin layer of dielectric (electrical insulation), upon which conductive traces are printed in copper. This type of construction is known as Insulated Metal Substrate (IMS). While IMS construction alleviates the thermal management problem due to the high thermal conductivity of the metal substrate being separated from the component by only a thin layer of dielectric, it includes additional constraints.

First, these constraints include limitations against multi-layer construction. This constraint severely limits the circuit complexity that can be implemented on an IMS circuit board since every location where circuit traces must cross without being connected demands a physical jumper component to act as a bridge.

Second, these constraints include limitations against fine-pitch components. Heavy copper thickness is required in the IMS circuit traces to carry high levels of current from power electronic components. This heavy copper thickness limits the fine detail that can be achieved in the printing or etching process. As a result, fine pitch components, for example on the order of 0.5 mm pitch between component connections, cannot be implemented on the same circuit board. This forces designers to use multiple circuit boards, placing the small components, those with fine pitch connections, and the complex circuits on a classical FR-4 or similar type circuit board, typically with multiple layers to assist in routing the complex circuitry. The designer would then place the power electronic components, along with larger components with coarser pitch (e.g., 1 mm or greater), and simple circuits with only a few bridging points, on an IMS circuit board. Finally, an interconnecting means is required between the IMS board and the FR-4 board, demanding even more space and cost.

Third, these constraints include a limited supply base. IMS boards must be procured from a limited supply base and are thus even more expensive to procure than would be expected from their already more expensive materials. IMS boards require special processing for assembly and are thus more expensive to process due to the limited number of assembly suppliers that process such boards.

Fourth, these constraints include lack of "quick-turn" suppliers. Classical multi-layer FR-4 printed circuit boards can be procured to a custom design within days from an established base of quick-turn suppliers. IMS circuit boards require a minimum of several weeks to be delivered for a prototype and thus slow the product development process and limit the number of prototypes that can be executed in a program.

SUMMARY

According to an aspect of the disclosure, a power electronics assembly includes a power component having a thermally and electrically conductive surface; a printed circuit board having a slot; and a bussing element having a protrusion that directly contacts the thermally and electrically conductive surface of the power component via the slot of the printed circuit board, the printed circuit board being disposed between the power component and the bussing element.

According to an aspect of the disclosure, a power electronics assembly may include a printed circuit board having a second surface and a first surface, and having a plurality of slots that extend between the second surface and the first surface; and a bussing element having a second surface and a first surface, and having a plurality of protrusions that extend from the second surface, wherein the first surface of the printed circuit board is disposed on the second surface of the bussing element, wherein the plurality of protrusions extend through the plurality of slots, and wherein the second surface of the printed circuit board and respective second surfaces of the plurality of protrusions form a substantially planar surface.

According to an aspect of the disclosure, a method of forming a power electronics assembly may include forming a printed circuit board to include a second surface, a first surface, and a plurality of slots that extend from the second surface to the first surface; forming a bussing element to include a second surface, a first surface, and a plurality of protrusions that extend from the second surface; and attaching the first surface of the printed circuit board to the second surface of the bussing element to permit the plurality of protrusions of the bussing element to extend through the plurality of slots of the printed circuit board.

According to an aspect of the disclosure, a battery may include a plurality of electrochemical cells that each have electrical terminals. The battery may include at least one electrical connection device that includes a printed circuit board having a second surface and a first surface, and having a plurality of slots that extend between the second surface and the first surface; and a bussing element having a second surface and a first surface, and having a plurality of protrusions that extend from the second surface, wherein the first surface of the printed circuit board is disposed on the second surface of the bussing element, wherein the plurality of protrusions extend through the plurality of slots, and wherein the second surface of the printed circuit board and respective second surfaces of the plurality of protrusions form a substantially planar surface.

DETAILED DESCRIPTION

The following detailed description of example implementations refers to the accompanying drawings. The same reference numbers in different drawings may identify the same or similar elements.

The present disclosure may address the limitations mentioned above by providing a multi-layer FR-4 printed circuit board integrated with bussing components to carry the large current directly from the power electronic components. The FR-4 circuitry may use a typical copper thickness (e.g., 35 to 70 μm), and the number of board layers may be 2, 4, 6, etc. Even with circuit traces printed to suit fine pitch component connection spacing of 0.5 mm or less, such FR-4 boards can be economically produced to a custom design from a wide supply base with very fast delivery of a few days when needed.

Since every application involving high current might require a connection means to bring that current onto the circuit board, busbars of some configuration may be required in any case. The present disclosure adds features to those busbars that enable the assembly of the busbars with an FR-4 circuit board such that the sub-assembly (e.g., busbars and FR-4 board) may be processed through a standard manufacturing flow. This would typically involve screen printing of solder paste, automatic component placement, and heating through an oven to solder the components in their positions.

Standard manufacturing flow is made possible since the design is such that once the subassembly is made, the second surface is substantially planar. This enables screen printing in standard equipment, component placement in existing pick-and-place equipment, inspection in existing Automated Optical Inspection equipment, and so on.

The embodiments of the present disclosure may eliminate the need for IMS in high power circuitry. IMS-based power circuitry is typically necessary for high power circuitry to aid heat dissipation and add thermal mass. There are some significant downsides to using IMS, such as a higher production cost and longer procurement times than an industry standard printed circuit board assembly. The embodiments of the present disclosure enable use of conventional PCBs (such as the material commonly known as FR-4) in conjunction with bussing elements as a replacement for the IMS. This allows a more cost and time effective design while provide substantially similar levels of the thermal and power density capabilities of the power circuitry.

Figure 1:
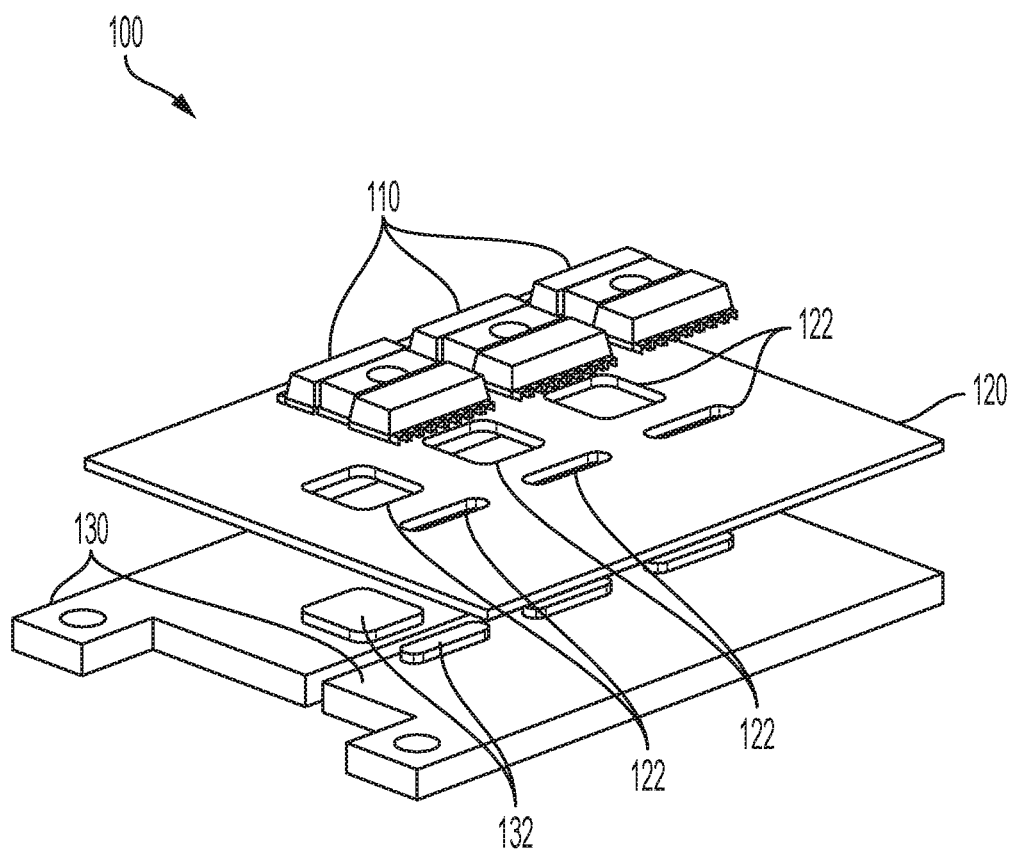
FIG. 1 is a diagram of a power electronics assembly according to an embodiment.

FIG. 1 is a diagram of an example power electronics assembly according to an embodiment. As shown in FIG. 1, the power electronics assembly 100 may include a power component 110, a PCB 120, and a bussing element 130.

The power electronics assembly 100 may be implemented in a battery system, an electronic device (e.g., television (TV), a smartphone, a computing device, etc.), a consumer appliance (e.g., a smart appliance, a washing machine, a dryer, a refrigerator, a dish washer, etc.), a display device (e.g., a light-emitting diode (LED) display, a liquid crystal display (LCD), etc.), or the like.

The power component 110 may be an electronic component (e.g., an active component, a passive component, and/or the like). For example, the power component 110 may be a transistor, a diode, an integrated circuit, an optoelectronic device, a power source, a resistor, a capacitor, a magnetic device, an inductor, or the like.

As examples, the power component 110 may a field-effect transistor (FET), such as a MOSFET, a p-type MOSFET (PMOS), an n-type MOSFET (NMOS), a complementary MOSFET (CMOS), a power MOSFET, a multi-gate field-effect transistor (MuGFET), a thin-film transistor, or the like.

Additionally, the power component 110 may be a junction field-effect transistor (JFET), a metal semiconductor FET (MESFET), a high-electron-mobility transistor (HEMT), and/or the like. Additionally, the power component 110 may be a composite transistor such as a bipolar CMOS, an insulated-gate bipolar transistor (IGBT), or the like. Alternatively, the power component 110 may a bipolar junction transistor (BJT), a photo transistor, or the like. Additionally, the power component 110 may be a thrysistor, such as a silicon-controlled rectifier (SCR), a bidirectional SCR, a unijunction transistor (UJT), a programmable unijunction transistor (PUT), or the like. Additionally, the power component 110 may be a light-emitting diode (LED), a power supply, an electronics module, or the like.

The PCB 120 may be a PCB that mechanically supports and connects power components 110. For example, the PCB 120 may a single-sided PCB, a double-sided PCB, a multi-layered PCB, or the like. The PCB 120 may be comprised of any suitable material, such as FR-2 (e.g., phenolic cotton paper), FR-3 (e.g., cotton paper and epoxy), FR-4 (e.g., woven glass and epoxy), FR-5 (e.g., woven glass and epoxy), FR-6 (e.g., matte glass and polyester), G-10 (e.g., woven glass and epoxy), CEM-1 (e.g., cotton paper and epoxy), CEM-2 (e.g., cotton paper and epoxy), CEM-3 (e.g., non-woven glass and epoxy), CEM-4 (e.g., woven glass and epoxy), CEM-5 (e.g., woven glass and polyester), or the like. Additionally, the PCB 120 may be a flexible PCB comprised of polyester (PET), polyimide (PI), polyethylene naphthalate (PEN), polyetherimide (PEI), or the like.

The bussing element 130 may be a component that is configured to distribute power. For example, the bussing element 130 may be a busbar, a bus, or the like. The bussing element 130 may be comprised of any suitable material, such as nickel, tin, aluminum, copper, or the like.

The power electronics assembly 100 may include any number of power components 110, PCBs 120, and/or bussing elements 130. Additionally, the power electronics assembly 100 may be comprised of any number of different types and combinations of power components 110, PCBs 120, and/or bussing elements 130.

The power component 110 may connect to the PCB 120 to permit the PCB 120 to carry signals to and from the power component 110. Further, the power component 110 may connect to the bussing element 130 to permit the bussing element 130 to provide power to the power component 110. In this way, the power component 110 may simultaneously connect to the PCB 120 for signal transmission and to the bussing element 130 for power transmission.

As shown in FIG. 1, the bussing element 130 may include a first surface, a set of side surfaces, and a second surface. Further, the bussing element 130 may include a protrusion 132 that extends from the second surface of the bussing element 130.

The first surface of the bussing element 130 may be substantially flat. The second surface of the bussing element 130 may be substantially flat except for portions that correspond to the protrusions 132. The protrusion 132 may include a second surface that is substantially flat, and a set of side surfaces that extend from the second surface of the bussing element 130 to the second surface of the protrusion 132. The protrusion 132 may include any size and shape. For example, in some cases, the second surface of a protrusion 132 may include a shape and size that corresponds to a shape and size of a first surface of a power component 110 to which the protrusion 132 is configured to connect. The bussing element 130 may include any number of protrusions 132. The second surface of the protrusion 132 may be plated or coated with a treatment, such as tin plating, to make the second surface solderable. This treatment may be applied to all surfaces of the busbar but assembly processing may be improved if the plating or treatment is not present upon the sides of the protrusions 132.

As shown in FIG. 1, the PCB 120 may include a first surface, a set of side surfaces, and a second surface. Further, the PCB 120 may include a slot 122 formed in the PCB 120. The first surface of the PCB 120 may be substantially flat. Further, the first surface of the PCB 120 may be configured to be connected to the second surface of the bussing element 130. The PCB 120 and the bussing element 130 may be connected via a screw, a bolt, an epoxy, an adhesive, or the like. The second surface of the PCB 120 may be substantially flat. The slot 122 may include a size and shape that corresponds to a protrusion 132 that is configured to extend into the slot 122. For example, a slot 122 may be configured to receive a protrusion 132. The PCB 120 may include a number of slots 122 that corresponds to a number of protrusions of the bussing element 130.

In this way, the PCB 120 may be connected to the bussing element 130, such that the protrusions 132 of the bussing element 130 are disposed within the slots 122 of the PCB 120. In this case, the second surface of the PCB 120 and the respective second surfaces of the protrusions 132 may form a substantially planar second surface. In other words, the second surfaces of the protrusions 132 may be flush with the second surface of the PCB 120 based on the PCB 120 being connected to the bussing element 130.

As shown in FIG. 1, the power component 110 may include a second surface, a set of side surfaces, and a first surface. The first surface of the power component 110 may be a thermally and electrically conductive surface, and may be configured to connect to the second surface of a protrusion 132 of the bussing element 130. For example, a first surface of the power component 110 may be connected to a second surface of a protrusion 132 via soldering.

In this way, the PCB 120 may be disposed on the bussing element 130 such that the protrusions 132 of the bussing element 130 extend through the slots 122 of the PCB 120, and the power components 110 may be connected to the protrusions 132 of the bussing element 130. Further, in this way, the power components 110 may be disposed on the PCB 120, and the PCB 120 may be disposed on the bussing element 130 based on the power electronics assembly 100 being assembled. Further still, in this way, the power components 110 may be disposed on the PCB 120 and connect to the PCB 120 for signal transmission, and may be disposed on the bussing elements 130 and connect to the bussing elements 130 for power transmission.

The power component 110 may include the first surface that includes an area that is greater than an area of the protrusion 132 of the bussing element 130. In this way, the power component 110 may overlap both the PCB 120 and the bussing element 130, and may simultaneously connect to the PCB 120 and the bussing element 130 for signal transmission and power transmission, respectively. In some cases, the power component 110 may connect to the PCB 120 via another connection mechanism such as a pin, or the like.

Although FIG. 1 depicts a particular arrangement and number of components, it should be understood that other arrangements and other numbers of components may be implemented by the power electronics assembly 100.

Figure 2:
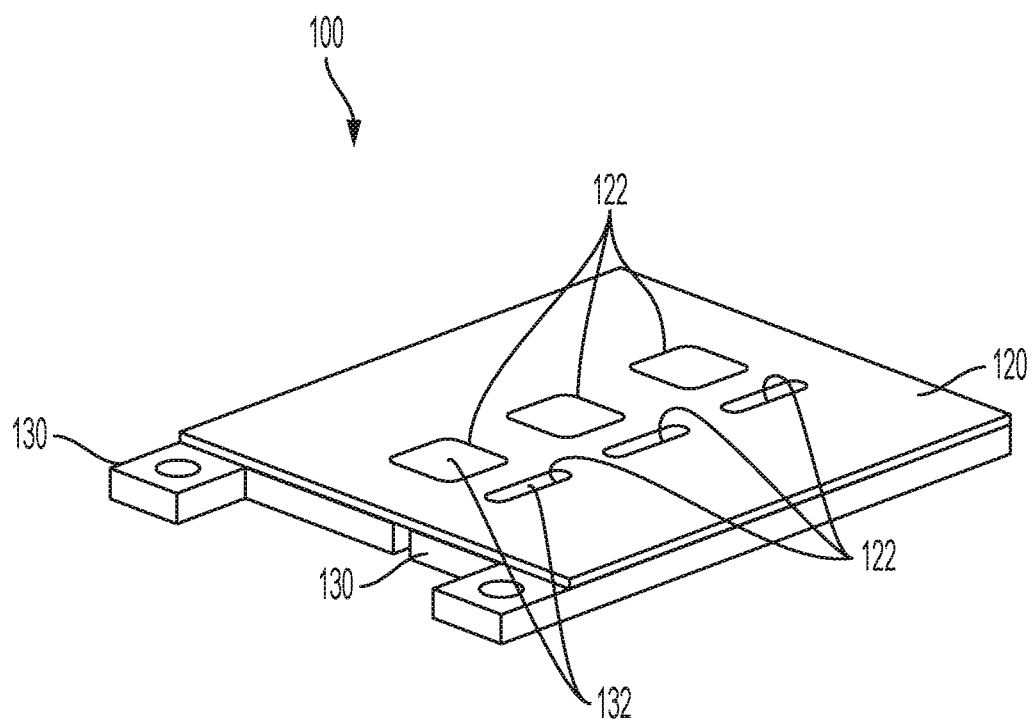
FIG. 2 is a diagram of a power electronics assembly according to an embodiment.

FIG. 2 is a diagram of a power electronics assembly according to an embodiment.

As shown in FIG. 2, the power electronics assembly 100 may include a PCB 120, and a bussing element 130. The PCB 120 and the bussing element 130 may be substantially the same as described above in association with FIG. 1.

The PCB 120 may be connected to the bussing element 130 such that the protrusions 132 of the bussing element 130 are disposed in the slots 122 of the PCB 120. In this case, and as shown in FIG. 2, the second surfaces of the protrusions 132 and the second surface of the PCB 120 may be substantially flush such that the PCB 120 and the bussing element 130 form a planar surface.

Figure 3:
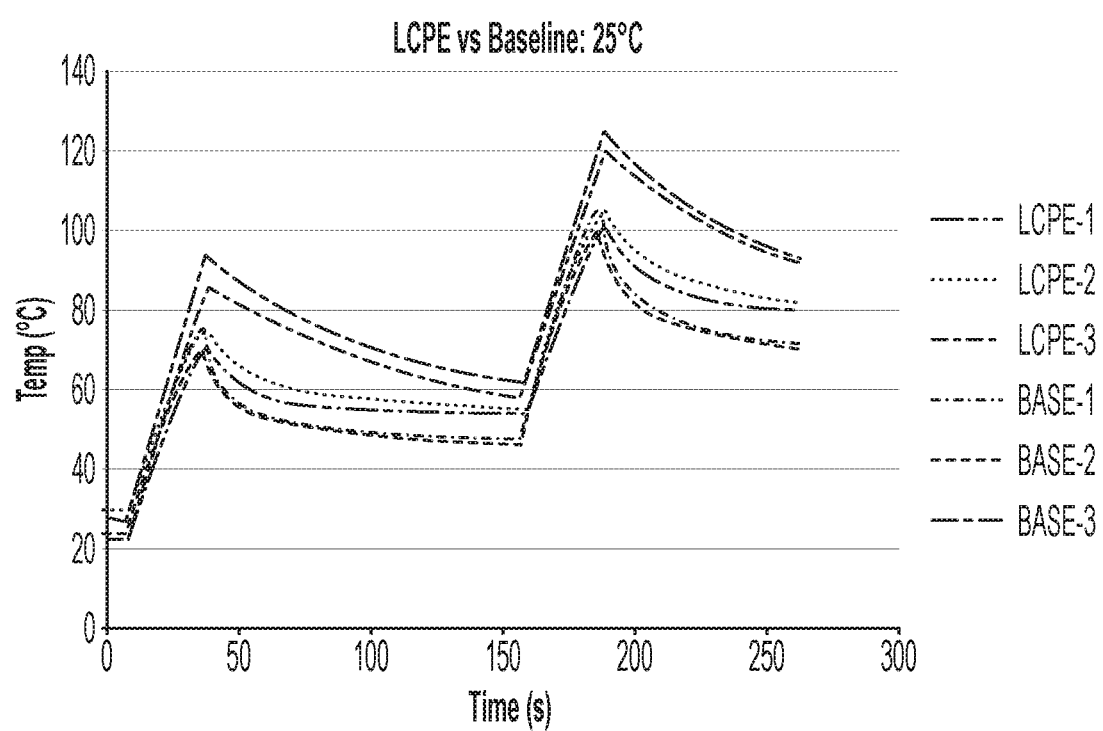
FIG. 3 is a diagram of example experimental results according to an embodiment.
Figure 4:
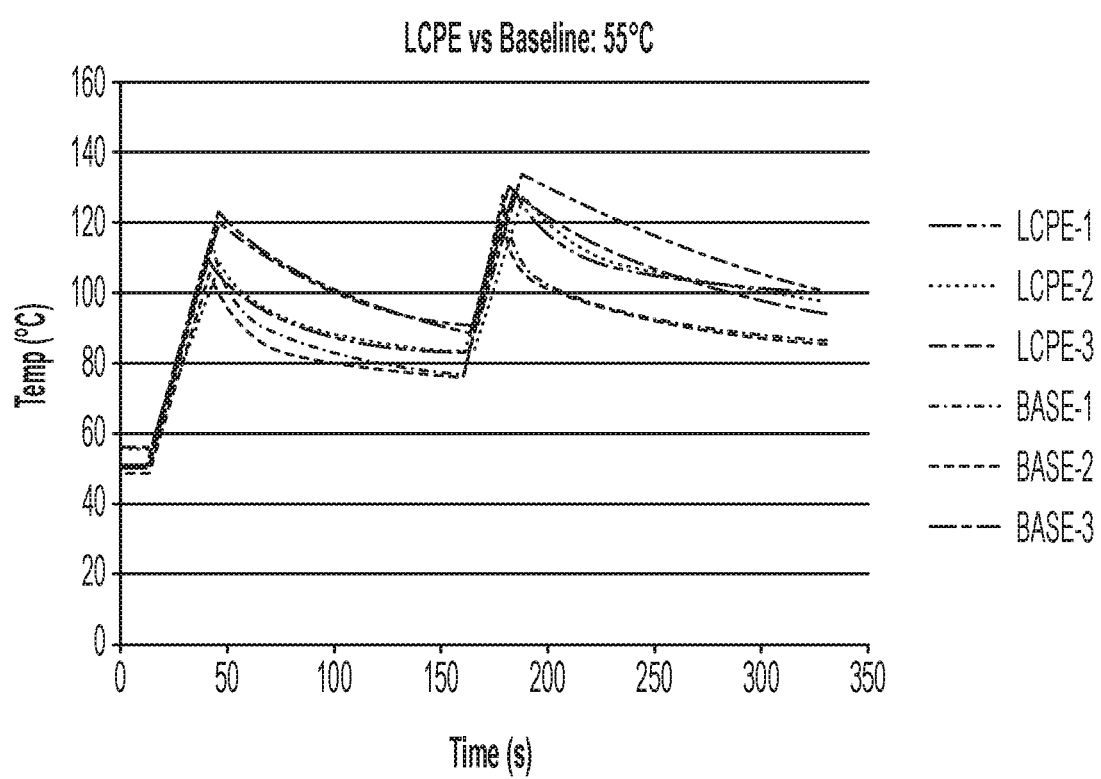
FIG. 4 is a diagram of example experimental results according to an embodiment.

FIGS. 3 and 4 are diagrams of example experimental results according to an embodiment. As shown in FIGS. 3 and 4, "LCPE-1," "LCPE-2," and "LCPE-3" may refer to various configurations of a power electronics assembly 100 according to the present disclosure, and "BASE-1," "BASE-2," and "BASE-3" may refer to related art configurations such as IMS configurations.

The power electronics assembly 100 was tested against a baseline design with similar power capabilities and thermal mass at several ambient temperatures. As shown in FIGS. 3 and 4, the tests involved an application of a 1100 A current for 30 seconds followed by a 2 minute rest, and another pulse of 1100 A for 30 seconds. The performance was similar, with the power electronics assembly 100 peaking at 10-15° C. above the IMS board.

Figure 5:
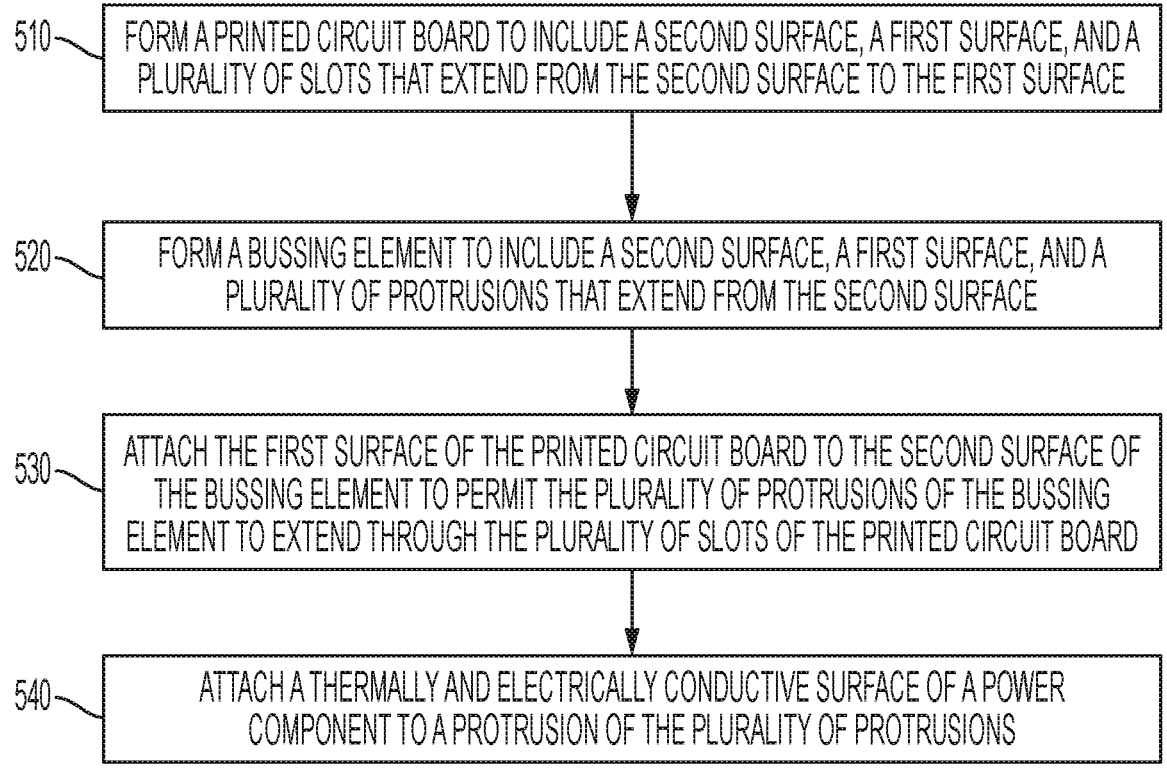
FIG. 5 is a diagram of an example process for forming a power electronics assembly according to an embodiment.

FIG. 5 is a diagram of an example process for forming a power electronics assembly according to an embodiment.

As shown in FIG. 5, a process may for forming the power electronics assembly 100 may include forming a PCB 120 to include a second surface, a first surface, and a plurality of slots 122 that extend from the second surface to the first surface (block 510).

In this way, the PCB 120 may be formed to include slots 122 via which protrusions 132 of a bussing element 130 may be inserted and disposed.

As further shown in FIG. 5, the process may include forming a bussing element 130 to include a second surface, a first surface, and a plurality of protrusions that extend from the second surface (block 520).

In this way, the bussing element 130 may be formed so as to include protrusions 132 that are configured to be disposed within the slots 122 of the PCB 120.

As further shown in FIG. 5, the process may include attaching the first surface of the PCB 120 to the second surface of the bussing element 130 to permit the plurality of protrusions 132 of the bussing element 130 to extend through the plurality of slots 122 of the PCB 120 (block 530).

In this way, the PCB 120 and the bussing element 130 may form a substantially planar second surface based on the PCB 120 being connected to the bussing element 130. Specifically, the second surfaces of the protrusions 132 and the second surface of the PCB 120 may form a substantially planar second surface.

As further shown in FIG. 5, the process may include attaching a thermally and electrically conductive surface of a power component 110 to a protrusion 132 of the plurality of protrusions 132 (block 540).

In this way, the power electronics assembly 100 may be assembled in a manner that permits improved thermal and electrical conductivity between the power components 110 and the bussing elements 130, such that thermal and electrical properties of the power electronics assembly 100 are improved. Further, in this way, the power electronics assembly 100 may be manufactured in an improved manner based on the power components 110 being connected to the protrusions 132 that form a planar surface with the PCB 120.

Figure 6:
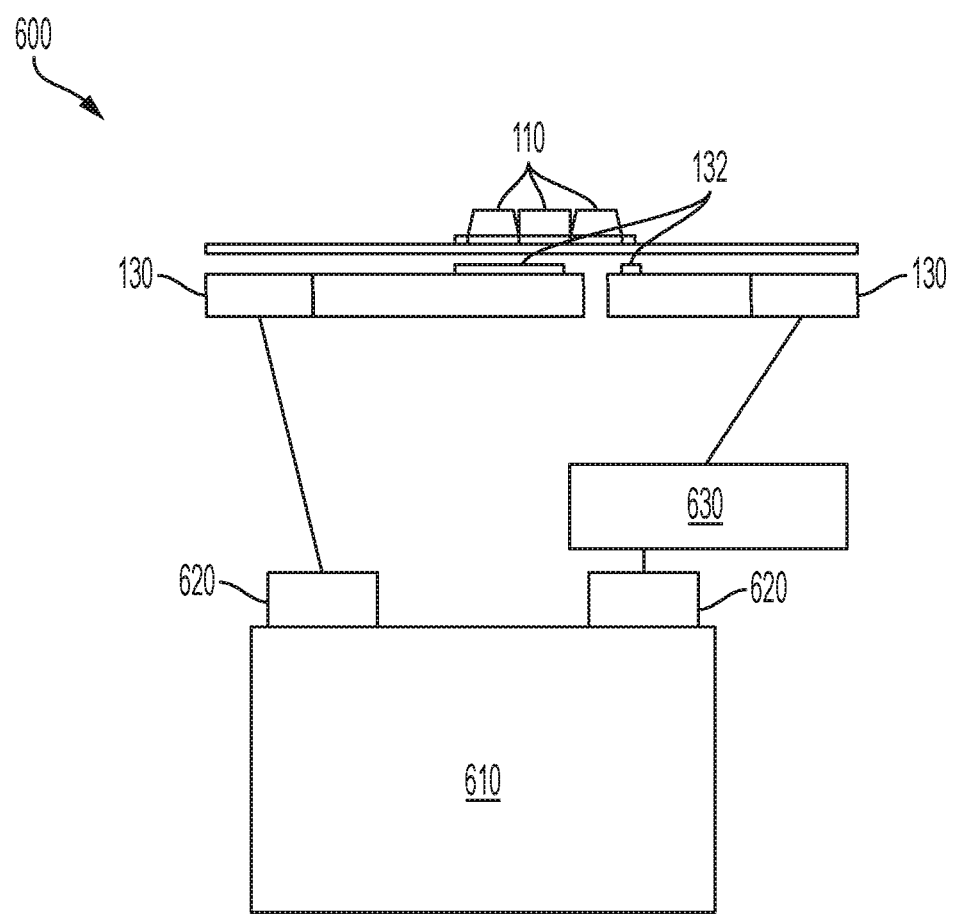
FIG. 6 is a diagram of a power electronics assembly according to an embodiment.

FIG. 6 is a diagram of power electronics assembly 100 according to an embodiment. As shown in FIG. 6, the power electronics assembly 100 may be implemented in a battery system 600. In some implementations, the battery system 600 may be a system substantially similar to the battery systems described in U.S. application Ser. No. 12/697,822 or 14/063,043, which are incorporated by reference herein in their entireties.

As shown in FIG. 6, the battery system 600 may include a storage cell 610 that is connected to the power electronics assembly 100. For example, a first output terminal 620 of the storage cell 610 may be connected to a first bussing element 130, and a second bussing element 130 may be connected to the load 630. Connecting the opposite output terminal 620 of the storage cell to the load 630 allows the power electronics assembly 100 to act as a load switch capable of controlling the output of the storage cell 610.

Although not shown, the battery system 600 may include any number of storage cells 610 connected in parallel or series.

Figure 7:
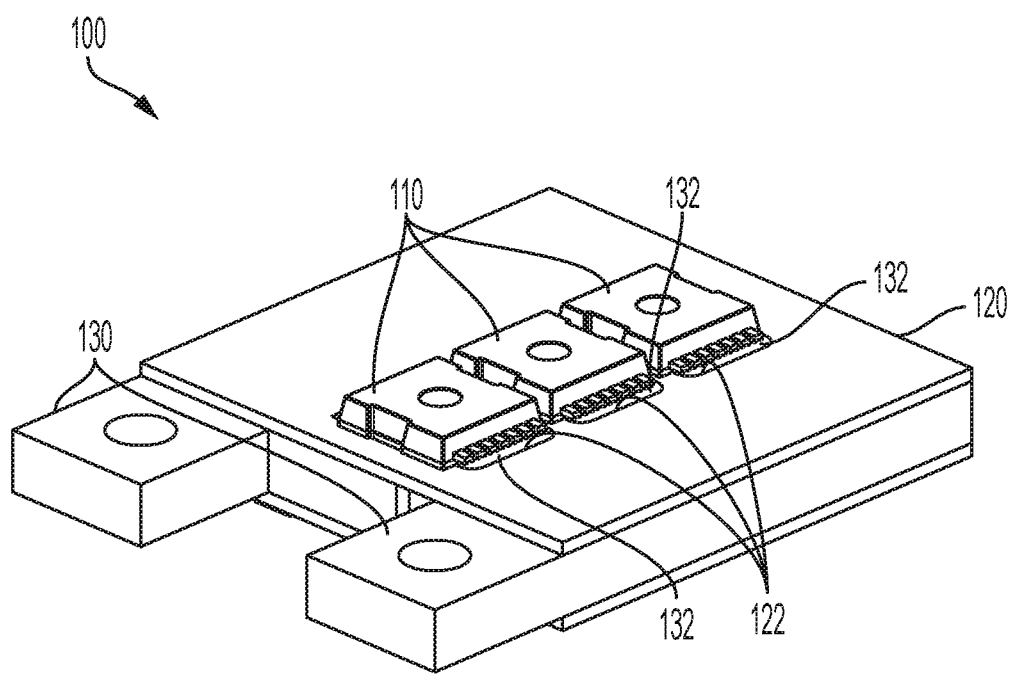
FIG. 7 is a diagram of a power electronics assembly according to an embodiment.

FIG. 7 is a diagram of a double-sided power electronics assembly 100. As shown in FIG. 7, the power electronics assembly 100 may include a power component 110, a first PCB 120, a bussing element 130, and a second PCB 120.

The bussing element 130 may include protrusions 132 disposed on a first surface (e.g., a top surface shown in FIG. 7), and may include protrusions 132 disposed on a second surface (e.g., a bottom surface shown in FIG. 7).

The first PCB 120 may be disposed on the first surface of the bussing element 130, and protrusions 132 of the bussing element 130 may extend through slots 122 of the first PCB 120. The power components 110 may contact the protrusions 132.

The second PCB 120 may be disposed on the second surface of the bussing element 130, and protrusions 132 of the bussing element 130 may extend through slots 122 of the second PCB 120. Power components 110 (not shown) may contact the protrusions 132.

Figure 8:
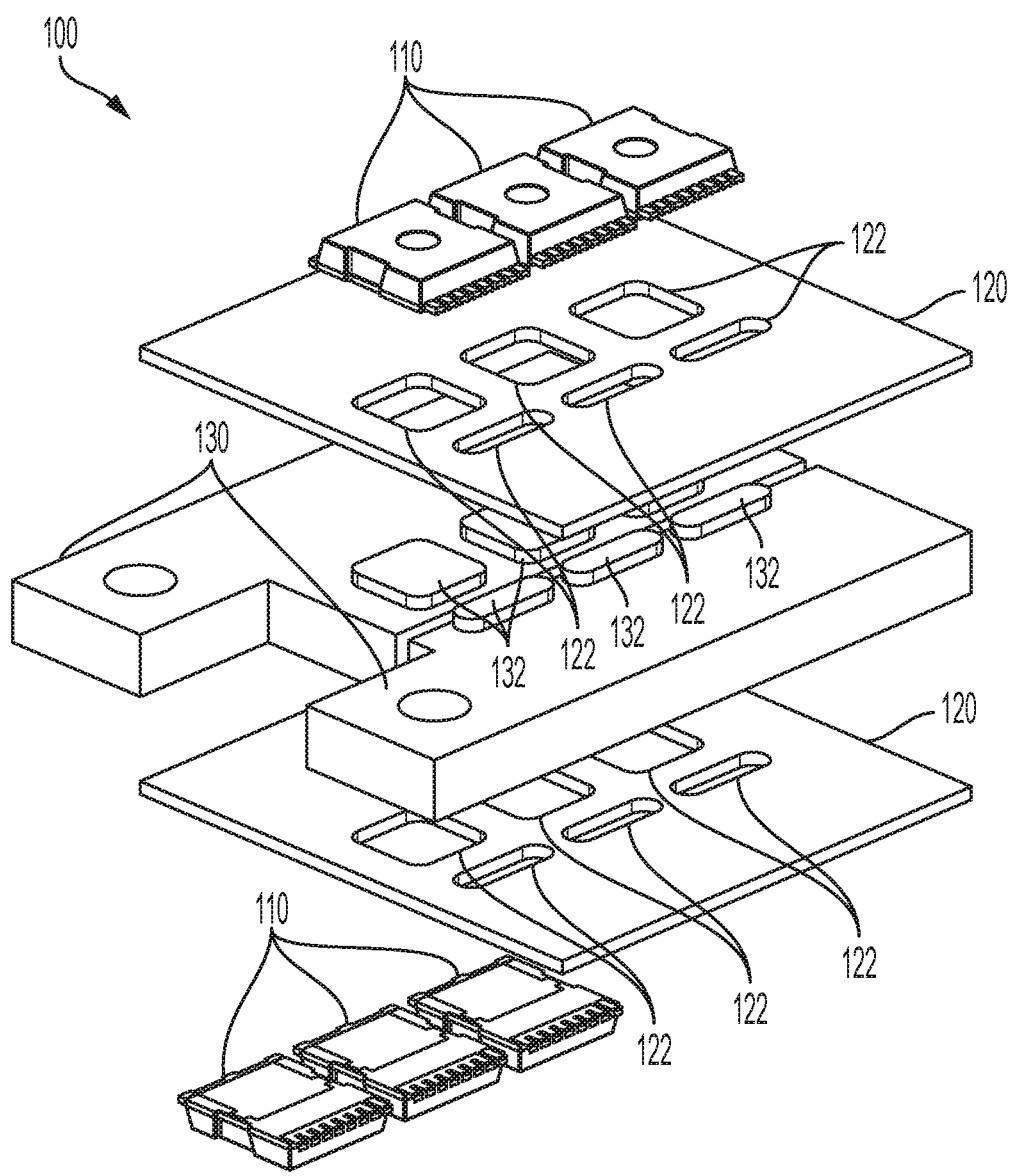
FIG. 8 is a diagram of a power electronics assembly according to an embodiment.

FIG. 8 is a diagram of a double-sided power electronics assembly 100. As shown in FIG. 8, the power electronics assembly 100 may include a first set of power components 110, a second set of power components 110, a first PCB 120, a bussing element 130, and a second PCB 120. The first set of power components 110 may be disposed on a first PCB 120 that is disposed on a first surface of the bussing element 130 (e.g., top surfaces shown in FIG. 8). The second set of power components 110 may be disposed on a second PCB 120 that is disposed on a second surface of the bussing element 130 (e.g., bottom surfaces as shown in FIG. 8).

Figure 9:
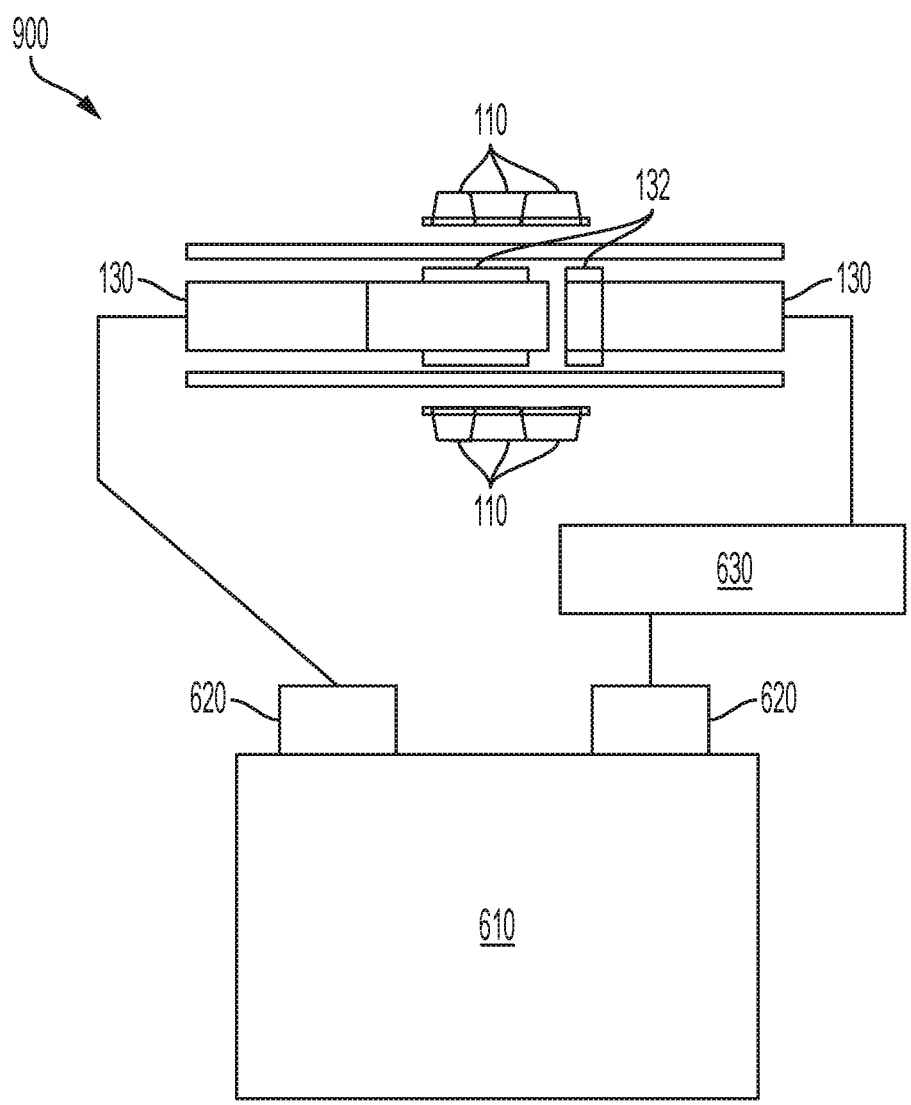
FIG. 9 is a diagram of a power electronics assembly according to an embodiment.

FIG. 9 is a diagram of power electronics assembly 100 according to an embodiment. As shown in FIG. 9, the power electronics assembly 100 may be implemented in a battery system 900. In some implementations, the battery system 900 may be a system substantially similar to the battery systems described in U.S. application Ser. No. 12/697,822 or 14/063,043.

As shown in FIG. 9, the battery system 900 may include a storage cell 610 that is connected to the power electronics assembly 100. For example, a first output terminal 620 of the storage cell 610 may be connected to a first bussing element 130, and a second bussing element 130 may be connected to the load 630. Connecting the opposite output terminal 620 of the storage cell to the load 630 allows the power electronics assembly 100 to act as a load switch capable of controlling the output of the storage cell 610.

Although not shown, the battery system 900 may include any number of storage cells 610 connected in parallel or series.

The first PCB 120 and the second PCB 120 may be disposed on respective surfaces of the bussing element 130, and power components 110 may connect to the first PCB 120 and the second PCB 120, respectively.

Figure 10:
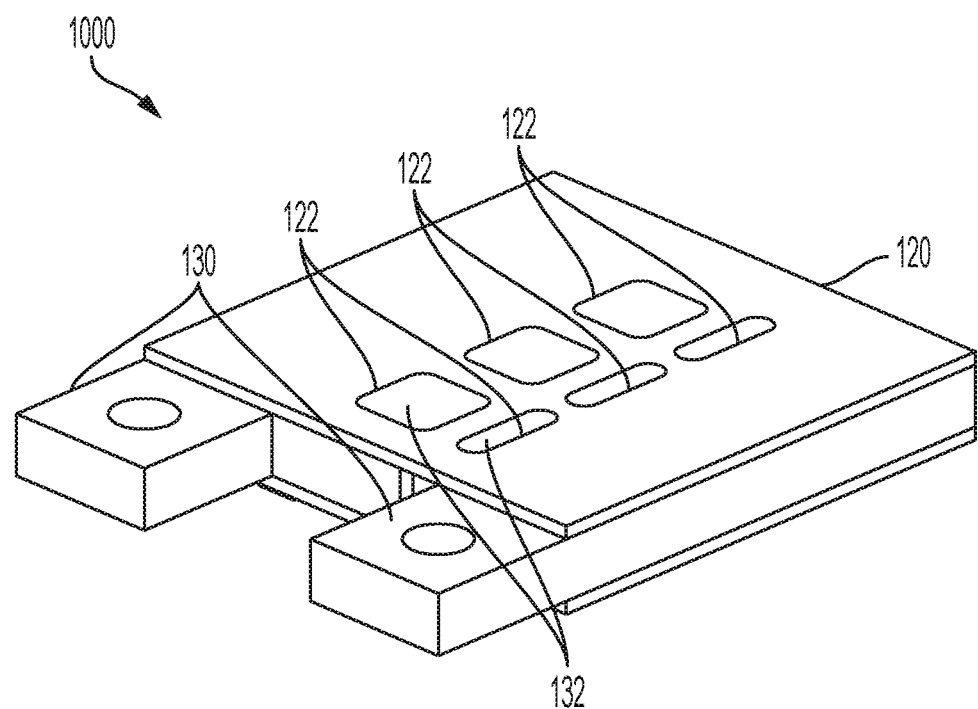
FIG. 10 is a diagram of a power electronics assembly according to an embodiment.

FIG. 10 is a diagram of a power electronics assembly 1000. The power electronics assembly 1000 may include the bussing element 130 having PCBs 120 disposed on respective surfaces of the bussing element 130. As shown, the surfaces formed by the PCBs 120 and the protrusions 132 may be substantially flush.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A battery comprising a plurality of electrochemical cells, each cell having electrical terminals, the battery further comprising at least one electrical connection device comprising:
   a printed circuit board having a second surface and a first surface, and having a plurality of slots that extend between the second surface and the first surface; and
   a bussing element having a second surface and a first surface, and having a plurality of protrusions that extend from the second surface,
   wherein the first surface of the printed circuit board is disposed on the second surface of the bussing element,
   wherein the plurality of protrusions extend through the plurality of slots, the plurality of slots including a size and shape that corresponds to a protrusion that is configured to extend into the slot, and
   wherein the second surface of the printed circuit board and respective second surfaces of the plurality of protrusions form a substantially planar surface.

2. The battery according to claim 1, further comprising:
   a power component having a thermally and electrically conductive surface, and that directly contacts a protrusion of the plurality of protrusions.

3. The battery according to claim 2, wherein the power component is one of a metal-oxide semiconductor field-effect transistor (MOSFET), a bipolar junction transistor (BJT), an insulated gate bipolar transistor (IGBT), a resistor, a light-emitting diode, a power supply, or an electronics module.

4. The battery according to claim 1, wherein the plurality of protrusions are configured to be directly soldered to a power component.

5. The battery according to claim 1, further comprising:
   another printed circuit board disposed on the bussing element.

6. The battery according to claim 1, wherein the bussing element is configured to connect to the printed circuit board via at least one of a screw, a bolt, an epoxy, or an adhesive.

* * * * *